(12) United States Patent
Bu et al.

(10) Patent No.: US 10,566,570 B2
(45) Date of Patent: Feb. 18, 2020

(54) COMPOSITE COVER FILM AND FLEXIBLE DISPLAY DEVICE

(71) Applicant: BOE TECHNOLOGY GROUP CO., LTD., Beijing (CN)

(72) Inventors: Dejun Bu, Beijing (CN); Paoming Tsai, Beijing (CN); Lu Liu, Beijing (CN); Liqiang Chen, Beijing (CN); Hong Li, Beijing (CN); Jianwei Li, Beijing (CN); Shuang Du, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/002,080

(22) Filed: Jun. 7, 2018

(65) Prior Publication Data
US 2019/0173051 A1    Jun. 6, 2019

(30) Foreign Application Priority Data

Dec. 4, 2017   (CN) .......................... 2017 1 1260723

(51) Int. Cl.
*H01L 51/00* (2006.01)
*H01L 51/52* (2006.01)
(Continued)

(52) U.S. Cl.
CPC ............ *H01L 51/5253* (2013.01); *C09J 7/25* (2018.01); *C09J 11/04* (2013.01); *H01L 27/322* (2013.01);
(Continued)

(58) Field of Classification Search
CPC .......................... H01L 51/5253; H01L 51/5256
(Continued)

(56) References Cited

U.S. PATENT DOCUMENTS

| 2015/0093568 A1* | 4/2015 | Kim ..................... C08K 5/3417 |
| | | 428/336 |
| 2016/0040027 A1* | 2/2016 | Woo ........................ B32B 5/024 |
| | | 428/336 |

(Continued)

FOREIGN PATENT DOCUMENTS

| CN | 105646881 A | 6/2016 |
| CN | 107075280 A | 8/2017 |
| JP | 2015198176 A | 11/2015 |

OTHER PUBLICATIONS

First Office Action for Chinese Application No. 201711260723.5, dated May 29, 2019, 8 Pages.
(Continued)

*Primary Examiner* — Steven H Loke
*Assistant Examiner* — Brandon C Fox
(74) *Attorney, Agent, or Firm* — Brooks Kushman P.C.

(57) ABSTRACT

The present disclosure relates to the field of display, in particular to a composite cover film and a flexible display device. The composite cover film comprises a polyimide layer, and a first hard coating and a first transparent optical adhesive layer disposed on two sides of the polyimide layer, respectively, wherein at least one of the first hard coating and the first transparent optical adhesive layer contains a nanoscale colorant. The present disclosure further relates to a flexible display device comprising a flexible display panel and the composite cover film disposed on a light-exiting side of the flexible display panel.

19 Claims, 3 Drawing Sheets

(51) Int. Cl.
*H01L 51/56* (2006.01)
*C09J 7/25* (2018.01)
*C09J 11/04* (2006.01)
*H01L 27/32* (2006.01)
*C08K 7/24* (2006.01)
*C08K 3/36* (2006.01)
*C08K 3/22* (2006.01)
*C08K 3/08* (2006.01)
*C08K 3/105* (2018.01)

(52) U.S. Cl.
CPC ........ *H01L 51/004* (2013.01); *H01L 51/0035* (2013.01); *H01L 51/5281* (2013.01); *H01L 51/56* (2013.01); *C08K 3/105* (2018.01); *C08K 3/36* (2013.01); *C08K 7/24* (2013.01); *C08K 2003/0806* (2013.01); *C08K 2003/0831* (2013.01); *C08K 2003/222* (2013.01); *C08K 2003/2241* (2013.01); *C08K 2003/2296* (2013.01); *C08K 2201/005* (2013.01); *C08K 2201/011* (2013.01); *C09J 2203/326* (2013.01); *C09J 2479/086* (2013.01); *H01L 27/323* (2013.01); *H01L 27/3244* (2013.01); *H01L 2251/5338* (2013.01)

(58) Field of Classification Search
USPC .................................................. 428/323, 336
See application file for complete search history.

(56) References Cited

U.S. PATENT DOCUMENTS

| 2016/0108256 | A1 | 4/2016 | Yang et al. | |
|---|---|---|---|---|
| 2016/0152866 | A1 | 6/2016 | Woo et al. | |
| 2016/0215181 | A1* | 7/2016 | Fujita | C09J 4/06 |
| 2017/0064845 | A1* | 3/2017 | Jung | H05K 1/028 |
| 2017/0169911 | A1* | 6/2017 | Hu | C22B 11/04 |
| 2018/0113350 | A1* | 4/2018 | Jee | C08G 73/14 |
| 2018/0134922 | A1* | 5/2018 | Katami | B32B 7/02 |

OTHER PUBLICATIONS

Cavalcante et al., "Color Performance of Ceramic Nano-Pigments," Dyes and Pigments, 2009, pp. 226-232, vol. 80—Iss. 2 (15 Pages).

Gardini et al., "Nano-Sized Ceramic Inks for Drop-on-Demand Ink-Jet Printing in Quadrichromy" Journal of Nanoscience and Nanotechnology, May 2008, pp. 1979-1988, vol. 8—No. 4 (11 Pages).

Jiang et al., "Ultrasonic-Assisted Synthesis of Monodisperse Single-Crystalline Silver Nanoplates and Gold Nanorings," Inorganic Chemistry, 2004, pp. 5877-5883, vol. 43—No. 19 (7 Pages).

Kelly et al., "Triangular Silver Nanoparticles: Their Preparation, Functionalisation and Properties," Acta Physica Polonica A, 2012, pp. 337-345, vol. 122—No. 2 (9 Pages).

Sun et al., "Gold and Silver Nanoparticles: A Class of Chromophores with Colors Tunable in the Range From 400 to 750 nm," The Analyst, pp. 686-691, vol. 128 (6 Pages).

* cited by examiner

COMPOSITE COVER FILM AND FLEXIBLE DISPLAY DEVICE

CROSS-REFERENCE TO RELATED APPLICATION

This application claims priority to Chinese Patent Application No. 201711260723.5 filed on Dec. 4, 2017, which is incorporated herein by reference in its entirety.

TECHNICAL FIELD

The present disclosure relates to the field of display, in particular to a composite cover film and a flexible display device.

BACKGROUND

With the development of display technologies, flexible display devices have become more and more widely used. The flexible display device includes a flexible display panel, a touch screen, a polarizing layer, and a cover film disposed on a light-exiting side of the flexible display panel.

Due to its excellent bending, thermal, mechanical and optical properties, a colorless polyimide (PI) film can perfectly match flexible display characteristics, and is an ideal material for the cover film for the future flexible display technology.

However, polyimide films currently applied in industry for the cover film can still be observed with a slight yellow hue, which corresponds to a positive value of $b^*$ ($b^*$=0.5~0.8) in the CIE (Commission Internationale de L'Eclairage) LAB scale. Due to its own slight yellow hue, such a polyimide film may cause slight color distortion in the flexible display device after it is applied to a flexible display panel.

SUMMARY

An object of the present disclosure is to provide a composite cover film and a flexible display device to improve the problems of the slight yellow hue and the color distortion which occur in the polyimide layer of the composite cover film or the flexible display device.

The present disclosure provides a composite cover film, which includes a polyimide layer, and a first hard coating and a first transparent optical adhesive layer disposed on two sides of the polyimide layer respectively, wherein at least one of the first hard coating and the first transparent optical adhesive layer contains a nanoscale colorant.

In one example, the composite cover film further comprises a second hard coating disposed between the polyimide layer and the first transparent optical adhesive layer.

In one example, the second hard coating contains the nanoscale colorant.

In one example, the nanoscale colorant has a spectrum adjustment effect at a wave band from 400 to 750 nm.

In one example, the nanoscale colorant includes nanoscale metal structures and/or nanoscale pigments, wherein the nanoscale metal structures are metal nanoplates, metal nanoparticles, metal nanoribbons, metal nanowires, metal nanorods, or metal nanoprisms, and metal in the nanoscale metal structures is one or more selected from the group consisting of silver, gold, indium, tin, aluminum, titanium, iron, copper and alloys thereof; and the nanoscale pigments are nanoscale silicon oxide, nanoscale titanium dioxide, nanoscale zinc oxide or nanoscale magnesium oxide.

In one example, the nanoscale metal structures have an average particle size of no more than 100 nm, and the nanoscale pigments have an average particle size of 10 to 50 nm.

In one example, the nanoscale metal structures are silver nanoparticles, gold-silver alloy nanoparticles, or silver nanotubes.

In one example, the first hard coating or the second hard coating is formed by curing the following components: 0.001 wt % to 40 wt % of the nanoscale colorant; 10 wt % to 20 wt % of a polymer; 0.02 wt % to 5 wt % of an adhesive; at least one additive, each having an amount of no more than 5 wt %; and the balance of a first solvent, wherein the first hard coating has a thickness of 15 nm to 50 μm.

In one example, the first hard coating or the second hard coating contains at least one of the additives.

In one example, the first transparent optical adhesive layer includes an optical adhesive layer which is formed by curing the following components: 1 to 20 parts by weight of the nanoscale colorant; 60 to 80 parts by weight of an optical adhesive; at least one additive, each having an amount of 0.1 to 2 parts by weight; and 20 to 40 parts by weight of a second solvent.

In one example, the first transparent optical adhesive layer includes a heavy release film, an optical adhesive layer and a light release adhesive film disposed in order; the light release adhesive film has a thickness of 25 μm to 75 μm and a releasing force of 2 to 20 g/f; and the heavy release film has a thickness of 50 μm to 125 μm and a releasing force of 30 to 100 g/f.

The present disclosure further provides a flexible display device which includes a flexible display panel and the composite cover film as described in the above technical solution, disposed on a light-exiting side of the flexible display panel.

The present disclosure further provides a flexible display device which includes a flexible display panel, a second transparent optical adhesive layer, a touch screen, a polarizing layer and the composite cover film as described in the above technical solution, which are disposed in order, wherein the second transparent optical adhesive layer contains the nanoscale colorant as described in the above technical solution.

In one example, the second transparent optical adhesive layer includes an optical adhesive layer which is formed by curing the following components: 1 to 20 parts by weight of the nanoscale colorant; 60 to 80 parts by weight of an optical adhesive; at least one additive, each having an amount of 0.1 to 2 parts by weight; and 20 to 40 parts by weight of a solvent.

The present disclosure further provides a method for manufacturing a flexible display device, which includes: providing a flexible display panel; forming a second transparent optical adhesive layer on a surface at a light-exiting side of the flexible display panel; sequentially forming a touch screen and a polarizing layer on the second transparent optical adhesive layer; and forming a first hard coating at one side of a polyimide layer and a first transparent optical adhesive layer at the other side of the polyimide layer, and bonding the polyimide layer and the polarizing layer together through the first transparent optical adhesive layer to obtain the flexible display device, wherein the first hard coating and/or the first transparent optical adhesive layer contain a nanoscale colorant, and the second transparent optical adhesive layer contains or does not contain the nanoscale colorant.

The present disclosure further provides a method for manufacturing a flexible display device, which includes: providing a flexible display panel; forming a second transparent optical adhesive layer on a surface at a light-exiting side of the flexible display panel; sequentially forming a touch screen and a polarizing layer on the second transparent optical adhesive layer; and forming a first hard coating and a second hard coating at two sides of a polyimide layer respectively, forming a first transparent optical adhesive layer on a side of the second hard coating away from the polyimide layer, and bonding the second hard coating and the polarizing layer together through the first transparent optical adhesive layer to obtain the flexible display device, wherein the first hard coating and/or the first transparent optical adhesive layer contain a nanoscale colorant, and the second transparent optical adhesive layer contains or does not contain the nanoscale colorant.

DETAILED DESCRIPTION

To further understand the present disclosure, preferred embodiments of the present disclosure are described hereinafter in conjunction with examples, but it should be understood that the description is merely for further explanation of features and advantages of the present disclosure, rather than for limitation of the claims of the present disclosure.

CIELAB is a color space specified by the Commission Internationale de L'Eclairage (CIE). The color space of CIELAB adopts a three-dimensional coordinate system, that is, L*, a* and b*, wherein L* represents the brightness of the color, a* represents the position of a color between red and green, b* represents the position between red and blue, and * indicates a normalized value relative to the standard white.

An embodiment of the present disclosure provides a composite cover film which includes a polyimide layer, and a first hard coating and a first transparent optical adhesive layer disposed on two sides of the polyimide layer, respectively, wherein at least one of the first hard coating and the first transparent optical adhesive layer contains a nanoscale colorant.

The composite cover film of the present disclosure is used for an outer layer of a display device, and the display device includes a flexible display panel, a touch screen, a polarizing layer and the composite cover film disposed in order.

Figure 1:
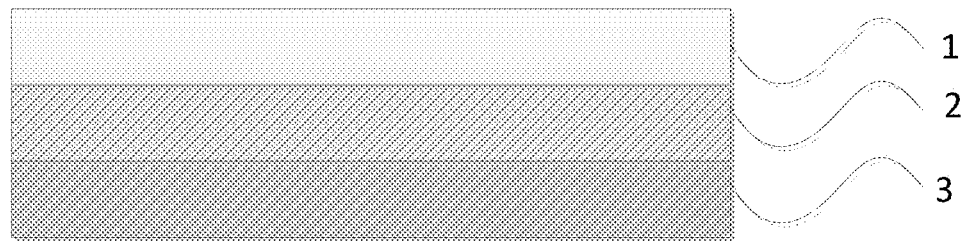
FIG. 1 shows a composite cover film provided in one embodiment of the present disclosure.

As shown in FIG. 1, the composite cover film includes a polyimide layer 2 as the main structure, and the polyimide layer 2 is made of a colorless polyimide thin film. The composite cover film further includes a first hard coating 1 and a first transparent optical adhesive layer 3 which are disposed on two sides of the polyimide layer, respectively. In one example, the first hard coating 1 has a thickness of 15 nm to 50 μm.

Figure 2:
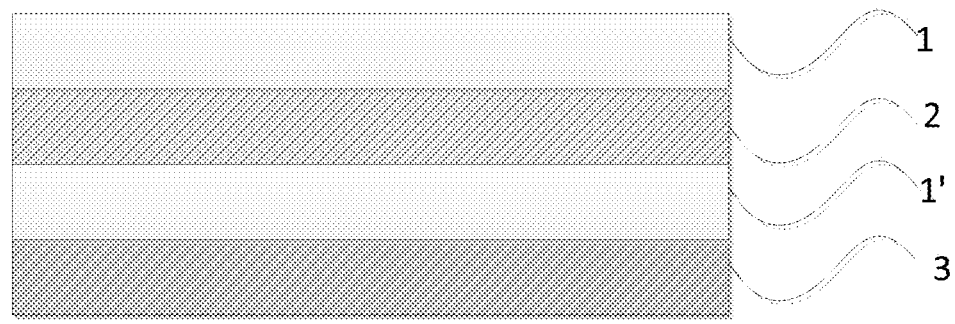
FIG. 2 shows a composite cover film provided in another embodiment of the present disclosure.

In one example, as shown in FIG. 2, the composite cover film further comprises a second hard coating 1' disposed between the polyimide layer 2 and the first transparent optical adhesive layer 3. A thickness of the second hard coating 1' is identical to or different from that of the first hard coating 1, and in one example, is 15 nm to 50 μm.

In one embodiments of the present disclosure, at least one of the first hard coating and the first transparent optical adhesive layer contains a nanoscale colorant. That is, either or both, of the first hard coating and the first transparent optical adhesive layer contain the nanoscale colorant.

In one example, the second hard coating also contains the nanoscale colorant.

In one example of the nanoscale colorant of the present disclosure, the nanoscale colorant has a spectrum adjustment effect at a wave band from 400 to 750 nm.

In one example, the nanoscale colorant includes nanoscale metal structures and/or nanoscale pigments.

The nanoscale metal structures may have different morphologies, compositions and structures, and show different surface plasmon resonances at a visible light wave band from 400 to 750 nm, and thus exhibit different spectrum adjustment effects.

In one example, the nanoscale metal structures are metal nanoplates, metal nanoparticles, metal nanoribbons, metal nanowires, metal nanorods, or metal nanoprisms.

In one example, the metal in the nanoscale metal structures is one or more selected from the group consisting of silver, gold, indium, tin, aluminum, titanium, iron, copper and alloys thereof.

For example, silver nanoparticles can transmit light waves with a wavelength of 400 to 450 nm, silver nanorods transmit light waves with a wavelength of 450 to 750 nm, gold nanoparticles transmit light waves with a wavelength of 480 to 550 nm, gold nanorods transmit light waves with a wavelength of 530 to 750 nm, gold-silver alloy nanoparticles transmit light waves with a wavelength of 400 to 450 nm, hollow gold nanoparticles transmit light waves with a wavelength of 530 to 750 nm, silver nanotubes transmit light waves with a wavelength of 400 to 550 nm, and silver nanoplates transmit light waves with a wavelength of 520 to 730 nm.

In one example, the nanoscale metal structures are silver nanoparticles, gold-silver alloy nanoparticles, or silver nanotubes. The nanoscale metal structures have a high transmittance at the blue-green light band and a low or even zero transmittance at a yellow light band, thus making it possible to effectively cooperate with the polyimide layer, so as to reduce the yellowing thereof.

The light waves transmitted through the nanoscale metal structures are also related to their particle size, and nanoscale metal structures having different particle sizes may exhibit different spectrum adjustment effects. In one example, an average particle size of the nanoscale metal structures is not more than 100 nm.

In the present disclosure, there is no particular limitation on the source of the nanoscale metal structures, and it may be prepared by physical evaporation and condensation, molecular beam epitaxy (MBE), mechanical ball milling, chemical vapor deposition (CVD), liquid phase precipitation, sol-gel, self-assembled monomolecular layer and surface patterning, hydrothermal/solvothermal methods, etc., or a commercially available product may be used.

The nanoscale pigments are nanoparticles of pigments which can exhibit different colors, and may be an inorganic composition, an organic composition or an organometallic composition. Some pigments may be processed to form nanoscale particles, or may be commercially available pigments having appropriate particle sizes, such as nanoscale silicon oxide, nanoscale titanium dioxide, nanoscale zinc oxide or nanoscale magnesium oxide. In one example, an average particle size of the nanoscale pigments is in a range of 10 to 50 nm.

In one example of the embodiment of the present disclosure, the first hard coating or the second hard coating is formed by curing the following components: 0.001 wt % to 40 wt % of the nanoscale colorant; 10 wt % to 20 wt % of a polymer; 0.02 wt % to 5 wt % of an adhesive; at least one additive, each having an amount of no more than 5 wt %; and the balance of a first solvent.

In one example, the polymer is a component commonly used in the hard coating of the related art, and may be polysiloxanes, polysilsesquioxanes, polyurethanes, acrylic resins, acrylic copolymers, cellulose ethers and esters, other water-insoluble polyethers, polyesters, polystyrene, styrene-butadiene copolymers, acrylonitrile-butadiene-styrene copolymers, polysulfides, and mixtures thereof.

In one example, the additive is an anti-oxidant, a wetting agent, a surfactant, a UV stabilizer, a defoamer, an anti-foaming agent, an anti-settling agent, a viscosity modifier or the like. The first hard coating or the second hard coating may include at least one of the additives.

In one example, the adhesive is a substance for adjusting the viscosity of uniformly-mixed components of the hard coating, which is usually glue, such as at least one or more selected form the group consisting of acrylics, silicon-based resins, polyurethanes, and epoxy resins.

In one example, the first solvent is water, alcohols, ketones, ethers, esters, aromatic compounds, alkanes and their analogues or mixtures thereof.

In one example, the first hard coating or the second hard coating is prepared by a method as follows:

mixing 0.001 wt % to 40 wt % of the nanoscale colorant, 10 wt % to 20 wt % of a polymer, 0.02 wt % to 5 wt % of an adhesive, at least one additive, each having an amount not more than 5 wt % and the balance of a first solvent, so as to form a mixture;

coating the mixture on one side of a polyimide layer and curing it to obtain a first hard coating; or coating the mixture on both sides of the polyimide layer and curing it to obtain a first hard coating and a second hard coating.

The coating may be performed by any of such as dip coating, spray coating, blade coating, bar coating, slit extrusion coating, spin coating, gravure printing, ink jet printing, or a similar method. The curing may be performed by ultra-violet (UV) curing, thermal curing or other radiation curing.

In one example of the embodiment of the present disclosure, the first transparent optical adhesive layer includes an optical adhesive layer, which is formed by curing the following components: 1 to 20 parts by weight of the nanoscale colorant; 60 to 80 parts by weight of an optical adhesive; at least one additive, each having an amount of 0.1 to 2 parts by weight; and 20 to 40 parts by weight of a solvent.

In one example, the optical adhesive is one or more selected form the group consisting of acrylics, silicon-based resins, polyurethanes, and epoxy resins.

In one example, the additive is an anti-oxidant, a wetting agent, a surfactant, a UV stabilizer, a defoamer, an anti-foaming agent, an anti-settling agent, a viscosity modifier or the like. The optical adhesive layer may include at least one of the additives.

In accordance with one example of the embodiment of the present disclosure, the first transparent optical adhesive layer includes a heavy release film, an optical adhesive layer and a light release adhesive film disposed in order. The light release adhesive film has a thickness of 25 µm to 75 µm, and a releasing force of 2 to 20 g/f. The light release adhesive film may be any of polyethylene terephthalate (PET), polyvinyl chloride (PVC), polycarbonate (PC), polyethylene (PE), and polypropylene (PP). The heavy release film has a thickness of 50 µm to 125 µm, and a releasing force of 30 to 100 g/f. The heavy release film may be any of polyethylene terephthalate (PET), polyvinyl chloride (PVC), polycarbonate (PC), polyethylene (PE), and polypropylene (PP).

In one example, the first transparent optical adhesive layer is prepared by a method as follows: mixing all the components for the optical adhesive layer to form a mixture, coating the mixture on the heavy release film, drying and curing to form the optical adhesive layer; then attaching the light release adhesive film on a side of the optical adhesive layer away from the heavy release film.

As compared with the related art, the composite cover film of the present disclosure includes the polyimide layer, and the first hard coating and the first transparent optical adhesive layer disposed on two sides of the polyimide layer, respectively, and at least one of the first hard coating and the first transparent optical adhesive layer contains the nanoscale colorant. The nanoscale colorant has the light adjustment effect at the visible light wave band, and by adding the nanoscale colorant to the hard coating or the transparent optical adhesive layer, it is possible to compensate for the slight yellow color introduced by the polyimide layer so as to generate a desired hue, especially to cooperate with the polyimide layer to produce whiter transmitted light, thereby improving the color distortion.

An embodiment of the present disclosure further provides a flexible display device which includes a flexible display panel and the composite cover film as described in the above technical solution, disposed on a light-exiting side of the flexible display panel.

In one example, the flexible display device includes a flexible display panel, a second transparent optical adhesive layer, a touch screen, a polarizing layer and a composite cover film disposed in order.

In one example, the flexible display panel includes a flexible substrate, a thin film transistor array, an organic light-emitting unit, and a thin film packaging layer disposed in order.

In one example, the flexible display device further includes a base film that supports the flexible substrate.

In one example, the second transparent optical adhesive layer contains the nanoscale colorant as described in the above technical solution.

In one example, the second transparent optical adhesive layer includes an optical adhesive layer which is formed by curing the following components: 1 to 20 parts by weight of the nanoscale colorant; 60 to 80 parts by weight of an optical adhesive; at least one additive, each having an amount of 0.1 to 2 parts by weight; and 20 to 40 parts by weight of a solvent.

In one example, the optical adhesive is at least one or more selected from the group consisting of acrylics, silicon-based resins, polyurethanes, and epoxy resins.

In one example, the additive is an anti-oxidant, a wetting agent, a surfactant, a UV stabilizer, a defoamer, an anti-foaming agent, an anti-settling agent, a viscosity modifier or the like. The optical adhesive layer may include at least one of the additives.

In accordance with an example of the embodiment of the present disclosure, the second transparent optical adhesive layer includes a heavy release film, an optical adhesive layer and a light release adhesive film disposed in order.

The light release adhesive film has a thickness of 25 µm to 75 µm and a releasing force of 2 to 20 g/f. The light release adhesive film may be any of PET, PVC, PC, PE, and PP. The heavy release film has a thickness of 50 µm to 125 µm, and a releasing force of 30 to 100 g/f. The heavy release film may be any of PET, PVC, PC, PE, and PP.

The second transparent optical adhesive layer is prepared by a method as follows: mixing all the components for the optical adhesive layer to form a mixture, coating the mixture on the heavy release film, drying and curing to form the optical adhesive layer; then attaching the light release adhesive film on a side of the optical adhesive layer away from the heavy release film.

The effect of the nanoscale colorant on the spectrum in the entire range of the visible light (from 400 to 750 nm) will result in strong absorption. After the addition of the nanoscale colorant, the flexible display device will have a reduced b*, the transmittance of the visible light will be reduced and a decrease in b* will be more significant. Therefore, by controlling an amount of the nanoscale colorant added in the above manner, it is possible to achieve a decrease in b* of at least 0.1 units without significantly sacrificing its optical properties, for example a decrease in the transmittance of visible light will be no more than about 2%. In one example, the experimental results showed the composite cover film of the present disclosure has a weakened yellow hue and a reduced b*, but the transmittance of visible light is not reduced by more than 2%.

As compared with the related art, the flexible display device involved in the present disclosure also includes the nanoscale colorant, and the nanoscale colorant has the light adjustment effect at the visible light wave band and can compensate for the slight yellow color introduced by the polyimide layer to generate a desired hue, and especially can cooperate with the polyimide layer to produce whiter transmitted light, thereby improving the color distortion.

According to an embodiment of the present disclosure, the flexible display device is manufactured by a method as follows: providing a flexible display panel; forming a second transparent optical adhesive layer on a surface at a light-exiting side of the flexible display panel; sequentially forming a touch screen and a polarizing layer on the second transparent optical adhesive layer; and forming a first hard coating at one side of a polyimide layer; forming a first transparent optical adhesive layer at the other side of the polyimide layer, and bonding the polyimide layer and the polarizing layer together through the first transparent optical adhesive layer to obtain the flexible display device, wherein the first hard coating and/or the first transparent optical adhesive layer contains a nanoscale colorant, and the second transparent optical adhesive layer contains or does not contain a nanoscale colorant.

Figure 3:
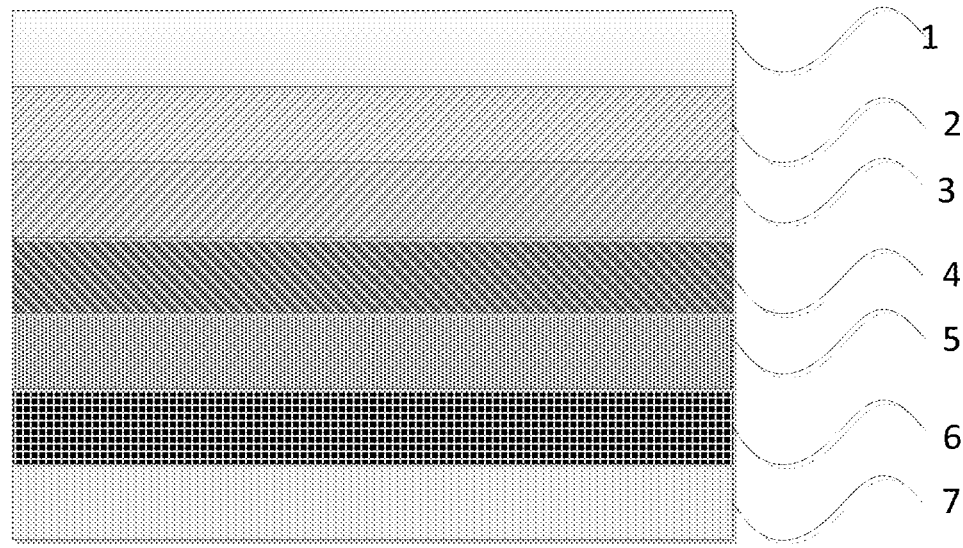
FIG. 3 shows a flexible display device provided in one embodiment of the present disclosure.

The flexible display device formed by the above manufacturing method is shown in FIG. 3. The flexible display device includes the flexible display panel 7, the second transparent optical adhesive layer 6, the touch screen 5, the polarizing layer 4, the first transparent optical adhesive layer 3, the polyimide layer 2 and the first hard coating 1, which are disposed in order.

In accordance with an embodiment of the present disclosure, a flexible display device may be also manufactured by a method as follow: providing a flexible display panel; forming a second transparent optical adhesive layer on a surface at a light-exiting side of the flexible display panel; sequentially forming a touch screen and a polarizing layer on the second transparent optical adhesive layer; forming a first hard coating and a second hard coating at two sides of a polyimide layer, respectively; forming a first transparent optical adhesive layer on a side of the second hard coating away from the polyimide layer, and bonding the second hard coating and the polarizing layer together through the first transparent optical adhesive layer to obtain the flexible display device, wherein the first hard coating and/or the first transparent optical adhesive layer contain a nanoscale colorant, and the second transparent optical adhesive layer contains or does not contain the nanoscale colorant.

Figure 4:
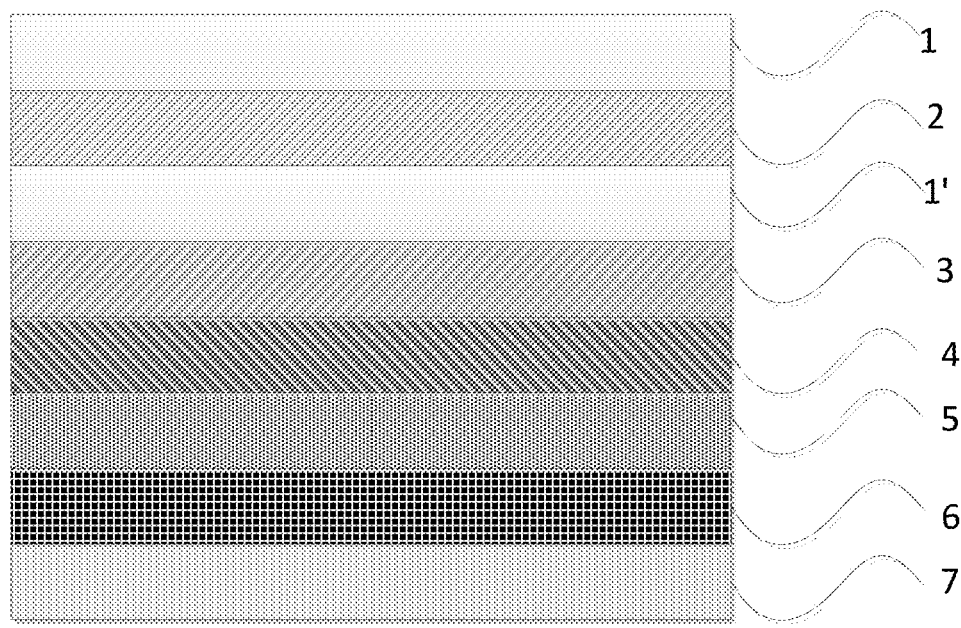
FIG. 4 shows a flexible display device provided in another embodiment of the present disclosure.

The flexible display device formed by the above manufacturing method is shown in FIG. 4. The flexible display device includes the flexible display panel 7, the second transparent optical adhesive layer 6, the touch screen 5, the polarizing layer 4, the first transparent optical adhesive layer 3, the second hard coating 1', the polyimide layer 2 and the first hard coating 1, which are disposed in order.

In accordance with an embodiment of the present disclosure, a flexible display device may be further manufactured by a method as follows: providing a flexible display panel which includes a flexible substrate, a thin film transistor array, an organic light-emitting unit and a thin film packaging layer disposed in order; forming a second transparent optical adhesive layer on the thin film packaging layer; sequentially forming a touch screen and a polarizing layer on the second transparent optical adhesive layer; forming a first hard coating at one side of a polyimide layer; forming a first transparent optical adhesive layer at the other side of the polyimide layer, and bonding the polyimide layer and the polarizing layer together by the first transparent optical adhesive layer to obtain the flexible display device, wherein the first hard coating and/or the first transparent optical adhesive layer contains a nanoscale colorant, and the second transparent optical adhesive layer contains or does not contain the nanoscale colorant.

Figure 5:
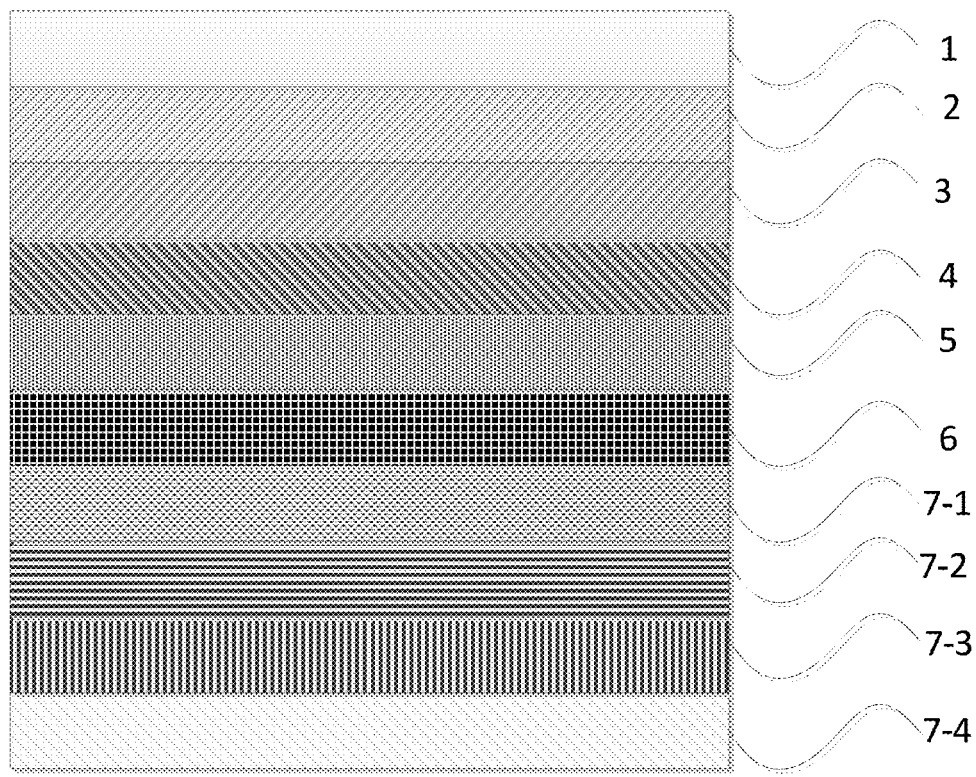
FIG. 5 shows a flexible display device provided in a further embodiment of the present disclosure.

The flexible display device formed by the above manufacturing method is shown in FIG. 5. The flexible display device includes the flexible substrate 7-4, the thin film transistor array 7-3, the organic light-emitting unit 7-2, the thin film packaging layer 7-1, the second transparent optical adhesive layer 6, the touch screen 5, the polarizing layer 4, the first transparent optical adhesive layer 3, the polyimide layer 2 and the first hard coating 1, which are disposed in order.

According to an embodiment of the present disclosure, the flexible display device may be further manufactured by a method as follows: providing a flexible display panel which includes a base film, a flexible substrate, a thin film transistor array, an organic light-emitting unit and a thin film packaging layer, which are disposed in order; forming a second transparent optical adhesive layer on the thin film packaging layer; sequentially forming a touch screen and a polarizing layer on the second transparent optical adhesive layer; forming a first hard coating and a second hard coating at two sides of a polyimide layer, respectively; forming a first transparent optical adhesive layer on a side of the second hard coating away from the polyimide layer, and bonding the second hard coating and the polarizing layer together through the first transparent optical adhesive layer to obtain the flexible display device, wherein the first hard coating and/or the first transparent optical adhesive layer contains a nanoscale colorant, and the second transparent optical adhesive layer contains or does not contain the nanoscale colorant.

Figure 6:
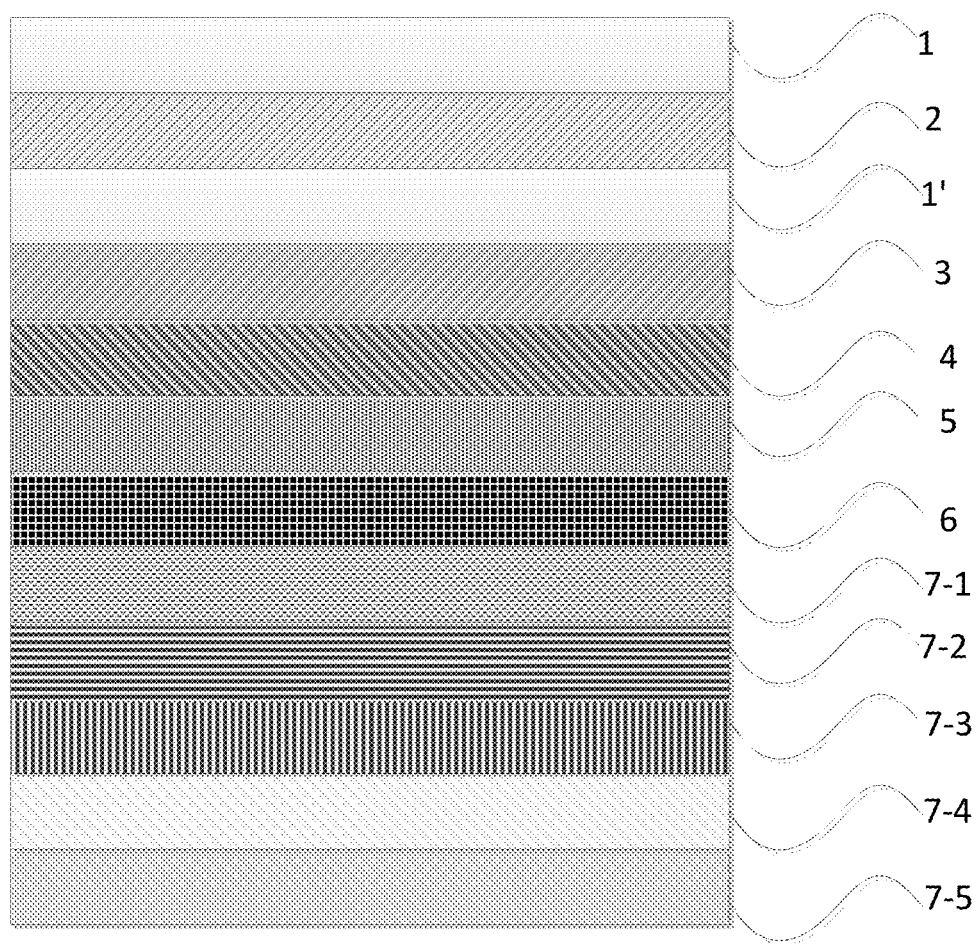
FIG. 6 shows a flexible display device provided in yet another embodiment of the present disclosure.

The flexible display device formed by the above manufacturing method is shown in FIG. 6. The flexible display device includes the base film 7-5, the flexible substrate 7-4, the thin film transistor array 7-3, the organic light-emitting unit 7-2, the thin film packaging layer 7-1, the second transparent optical adhesive layer 6, the touch screen 5, the polarizing layer 4, the first transparent optical adhesive layer 3, the second hard coating 1', the polyimide layer 2 and the first hard coating 1, which are disposed in order.

The above description of the embodiments is merely for helping understanding the method of the present disclosure and its core idea. It should be indicated that a person skilled in the art can make several improvements and modifications to the present disclosure without departing from the principle of the present disclosure. Such improvements and modifications also fall within the protection scope of the appended claims of the present disclosure.

The above description of the disclosed embodiments enables a person skilled in the art to implement or use the present disclosure. Various modifications to these embodiments will be readily apparent to a person skilled in the art, and a general principle defined herein may be implemented in other embodiments without departing from the spirit or scope of the present disclosure. Therefore, the present disclosure will not be limited to these embodiments disclosed herein, but will accord with the widest scope consistent with principle and novel features disclosed herein.

What is claimed is:

1. A composite cover film, comprising a polyimide layer, and a first hard coating and a first transparent optical adhesive layer disposed on two sides of the polyimide layer, respectively, wherein at least one of the first hard coating and the first transparent optical adhesive layer contains a nanoscale colorant,
    wherein the first hard coating is formed by curing the following components: 0.001 wt % to 40 wt % of the nanoscale colorant; 10 wt % to 20 wt % of a polymer; 0.02 wt % to 5 wt % of an adhesive; at least one additive, each having an amount of no more than 5 wt %; and a first solvent, and
    wherein the first hard coating has a thickness of 15 nm to 50 µm.

2. The composite cover film according to claim 1, further comprising a second hard coating disposed between the polyimide layer and the first transparent optical adhesive layer.

3. The composite cover film according to claim 2, wherein the second hard coating contains the nanoscale colorant.

4. The composite cover film according to claim 2, wherein the second hard coating is formed by curing the following components:
    0.001 wt % to 40 wt % of the nanoscale colorant;
    10 wt % to 20 wt % of a polymer;
    0.02 wt % to 5 wt % of an adhesive;
    at least one additive, each having an amount of no more than 5 wt %; and
    a first solvent,
    wherein the second hard coating has a thickness of 15 nm to 50 µm.

5. The composite cover film according to claim 1, wherein the nanoscale colorant have a spectrum adjustment effect at a wave band from 400 to 750 nm.

6. The composite cover film according to claim 1, wherein the nanoscale colorant comprises nanoscale metal structures and/or nanoscale pigments;
    the nanoscale metal structures are metal nanoplates, metal nanoparticles, metal nanoribbons, metal nanowires, metal nanorods, or metal nanoprisms, and metal in the nanoscale metal structures is one or more selected from the group consisting of silver, gold, indium, tin, aluminum, titanium, iron, copper and alloys thereof; and
    the nanoscale pigments are nanoscale silicon oxide, nanoscale titanium dioxide, nanoscale zinc oxide or nanoscale magnesium oxide.

7. The composite cover film according to claim 6, wherein the nanoscale metal structures have an average particle size of no more than 100 nanometers, and the nanoscale pigments have an average particle size of 10 to 50 nm.

8. The composite cover film according to claim 6, wherein the nanoscale metal structures are silver nanoparticles, gold-silver alloy nanoparticles, or silver nanotubes.

9. The composite cover film according to claim 1, wherein the first transparent optical adhesive layer comprises an optical adhesive layer which is formed by curing the following components:
    1 to 20 parts by weight of the nanoscale colorant;
    60 to 80 parts by weight of an optical adhesive;
    at least one additive, each having an amount of 0.1 to 2 parts by weight; and
    20 to 40 parts by weight of a second solvent.

10. The composite cover film according to claim 1, wherein the first transparent optical adhesive layer comprises a heavy release film, an optical adhesive layer and a light release adhesive film disposed in order;
    the light release adhesive film has a thickness of 25 µm to 75 µm and a releasing force of 2 to 20 g/f; and
    the heavy release film has a thickness of 50 µm to 125 µm and a releasing force of 30 to 100 g/f.

11. A flexible display device, comprising a flexible display panel and the composite cover film according to claim 1 disposed at a light-exiting side of the flexible display panel.

12. The flexible display device according to claim 11, wherein the composite cover film further comprises a second hard coating disposed between the polyimide layer and the first transparent optical adhesive layer.

13. The flexible display device according to claim 11, further comprising a second transparent optical adhesive layer, a touch screen and a polarizing layer, wherein the flexible display panel, the second transparent optical adhesive layer, the touch screen, the polarizing layer and the composite cover film are disposed in order, and the second transparent optical adhesive layer contains the nanoscale colorant, wherein the nanoscale colorant comprises nanoscale metal structures and/or nanoscale pigments;
    the nanoscale metal structures are metal nanoplates, metal nanoparticles, metal nanoribbons, metal nanowires, metal nanorods, or metal nanoprisms, and metal in the nanoscale metal structures is one or more selected from the group consisting of silver, gold, indium, tin, aluminum, titanium, iron, copper and alloys thereof; and
    the nanoscale pigments are nanoscale silicon oxide, nanoscale titanium dioxide, nanoscale zinc oxide or nanoscale magnesium oxide.

14. The flexible display device according to claim 13, wherein the composite cover film further comprises a second hard coating disposed between the polyimide layer and the first transparent optical adhesive layer.

15. The flexible display device according to claim 13, wherein the second transparent optical adhesive layer comprises an optical adhesive layer which is formed by curing the following components:
  1 to 20 parts by weight of the nanoscale colorant;
  60 to 80 parts by weight of an optical adhesive;
  at least one additive, each having an amount of 0.1 to 2 parts by weight; and
  20 to 40 parts by weight of a third solvent.

16. A method for manufacturing the flexible display device according to claim 11, comprising:
  providing the flexible display panel;
  forming a second transparent optical adhesive layer on a surface at the light-exiting side of the flexible display panel;
  sequentially forming a touch screen and a polarizing layer on the second transparent optical adhesive layer; and
  forming the first hard coating at one side of the polyimide layer, and a first transparent optical adhesive layer at the other side of the polyimide layer, and bonding the polyimide layer and the polarizing layer together through the first transparent optical adhesive layer to obtain the flexible display device,
  and
  the second transparent optical adhesive layer contains or does not contain the nanoscale colorant.

17. A method for manufacturing the flexible display device according to claim 11, comprising:
  providing the flexible display panel;
  forming a second transparent optical adhesive layer on a surface at the light-exiting side of the flexible display panel;
  sequentially forming a touch screen and a polarizing layer on the second transparent optical adhesive layer; and
  forming the first hard coating and a second hard coating at the two sides of the polyimide layer, respectively, forming the first transparent optical adhesive layer at a side of the second hard coating away from the polyimide layer, and bonding the second hard coating and the polarizing layer together through the first transparent optical adhesive layer to obtain the flexible display device,
  wherein the second transparent optical adhesive layer contains or does not contain the nanoscale colorant.

18. A composite cover film, comprising a polyimide layer, and a first hard coating and a first transparent optical adhesive layer disposed on two sides of the polyimide layer, respectively, wherein at least one of the first hard coating and the first transparent optical adhesive layer contains a nanoscale colorant, wherein the composite cover film further comprising a second hard coating disposed between the polyimide layer and the first transparent optical adhesive layer, wherein the second hard coating is formed by curing the following components:
  0.001 wt % to 40 wt % of the nanoscale colorant;
  10 wt % to 20 wt % of a polymer;
  0.02 wt % to 5 wt % of an adhesive;
  at least one additive, each having an amount of no more than 5 wt %; and
  a first solvent,
  wherein the second hard coating has a thickness of 15 nm to 50 μm.

19. A composite cover film, comprising a polyimide layer, and a first hard coating and a first transparent optical adhesive layer disposed on two sides of the polyimide layer, respectively, wherein at least one of the first hard coating and the first transparent optical adhesive layer contains a nanoscale colorant, wherein the first transparent optical adhesive layer comprises an optical adhesive layer which is formed by curing the following components:
  1 to 20 parts by weight of the nanoscale colorant;
  60 to 80 parts by weight of an optical adhesive;
  at least one additive, each having an amount of 0.1 to 2 parts by weight; and
  20 to 40 parts by weight of a solvent.

\* \* \* \* \*